United States Patent
Morita et al.

(10) Patent No.: US 12,342,684 B2
(45) Date of Patent: Jun. 24, 2025

(54) DISPLAY DEVICE

(71) Applicant: Japan Display Inc., Tokyo (JP)

(72) Inventors: Tetsuo Morita, Tokyo (JP); Sho Yanagisawa, Tokyo (JP); Kenji Harada, Tokyo (JP); Hiroshi Tabatake, Tokyo (JP); Hideyuki Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 542 days.

(21) Appl. No.: 17/657,955

(22) Filed: Apr. 5, 2022

(65) Prior Publication Data

US 2022/0352269 A1 Nov. 3, 2022

(30) Foreign Application Priority Data

Apr. 28, 2021 (JP) ................. 2021-076010

(51) Int. Cl.
*H10K 59/122* (2023.01)
*H10K 50/813* (2023.01)
(Continued)

(52) U.S. Cl.
CPC ......... *H10K 59/122* (2023.02); *H10K 50/824* (2023.02); *H10K 50/813* (2023.02); *H10K 59/38* (2023.02)

(58) Field of Classification Search
CPC .. H10K 59/122; H10K 50/824; H10K 50/813; H10K 59/38; H10K 59/80522; H10K 59/80515; H10K 2102/3026; H10K 2102/351; H10K 71/164; H10K 59/173; H10K 59/352; H10K 59/353
See application file for complete search history.

(56) References Cited

U.S. PATENT DOCUMENTS

2002/0158835 A1* 10/2002 Kobayashi ....... H10K 59/80522
345/100
2014/0183501 A1* 7/2014 Kim ................. H10K 59/80516
438/34
(Continued)

FOREIGN PATENT DOCUMENTS

| CN | 112420943 A | 2/2021 |
|---|---|---|
| DE | 102018132497 A1 | 6/2019 |

(Continued)

OTHER PUBLICATIONS

Office Action issued on Mar. 20, 2025, in corresponding German Application No. 102022203366.3, 19 pages.

*Primary Examiner* — Julia Slutsker
(74) *Attorney, Agent, or Firm* — Maier & Maier, PLLC

(57) ABSTRACT

According to one embodiment, a display device comprising a base, a first insulating layer, a first lower electrode, a second lower electrode, a first wiring, a second insulating layer disposed on the first wiring, a first organic layer disposed on the first lower electrode, a second organic layer disposed on the second lower electrode, a first separation wall disposed on the second insulating layer, and an upper wiring disposed continuously on the first organic layer, the second organic layer, and the first separation wall, wherein the upper wiring is electrically connected to the first wiring via a contact hole that penetrates the first separation wall and the second insulating layer.

11 Claims, 7 Drawing Sheets

(51) Int. Cl.
  *H10K 50/824*     (2023.01)
  *H10K 59/38*      (2023.01)

(56) References Cited

U.S. PATENT DOCUMENTS

| | | |
|---|---|---|
| 2016/0315133 A1 | 10/2016 | Sato |
| 2017/0069695 A1* | 3/2017 | Choung ................ H10K 59/35 |
| 2019/0198806 A1 | 6/2019 | Im et al. |
| 2019/0229152 A1* | 7/2019 | Wang ................... H10K 59/122 |
| 2020/0212162 A1 | 7/2020 | Fan |
| 2021/0296425 A1 | 9/2021 | Ochi et al. |

FOREIGN PATENT DOCUMENTS

| | | |
|---|---|---|
| JP | 2008-135325 A | 6/2008 |
| WO | WO 2020/079805 A1 | 4/2020 |

\* cited by examiner

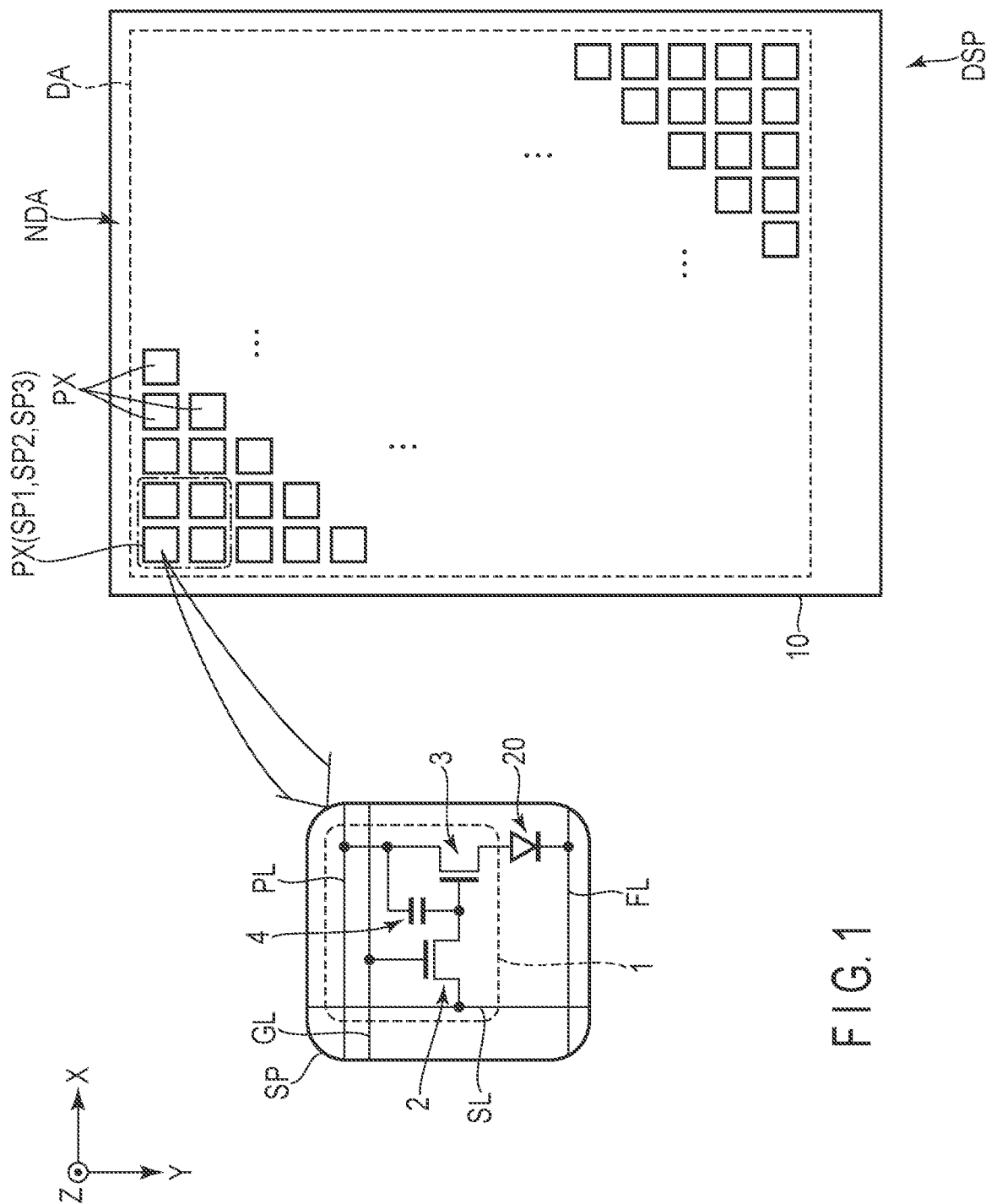
F I G. 1

DISPLAY DEVICE

CROSS-REFERENCE TO RELATED APPLICATIONS

This application is based upon and claims the benefit of priority from Japanese Patent Application No. 2021-076010, filed Apr. 28, 2021, the entire contents of which are incorporated herein by reference.

FIELD

Embodiments described herein relate generally to a display device.

BACKGROUND

In recent years, a display device to which an organic light-emitting diode (OLED) is applied as a display element has been put into practical use. The display element is provided with an organic layer between a pixel electrode and a common electrode. In addition to a light-emitting layer, the organic layer includes functional layers such as a hole transport layer and an electron transport layer. These organic layers are formed, for example, by a vacuum deposition method. In a case where two adjacent organic layers are in contact, a leak path may occur, which may disable proper current flow.

BRIEF DESCRIPTION OF THE DRAWINGS

FIG. 1 shows a configuration example of a display device according to an embodiment.

DETAILED DESCRIPTION

Figure 2:
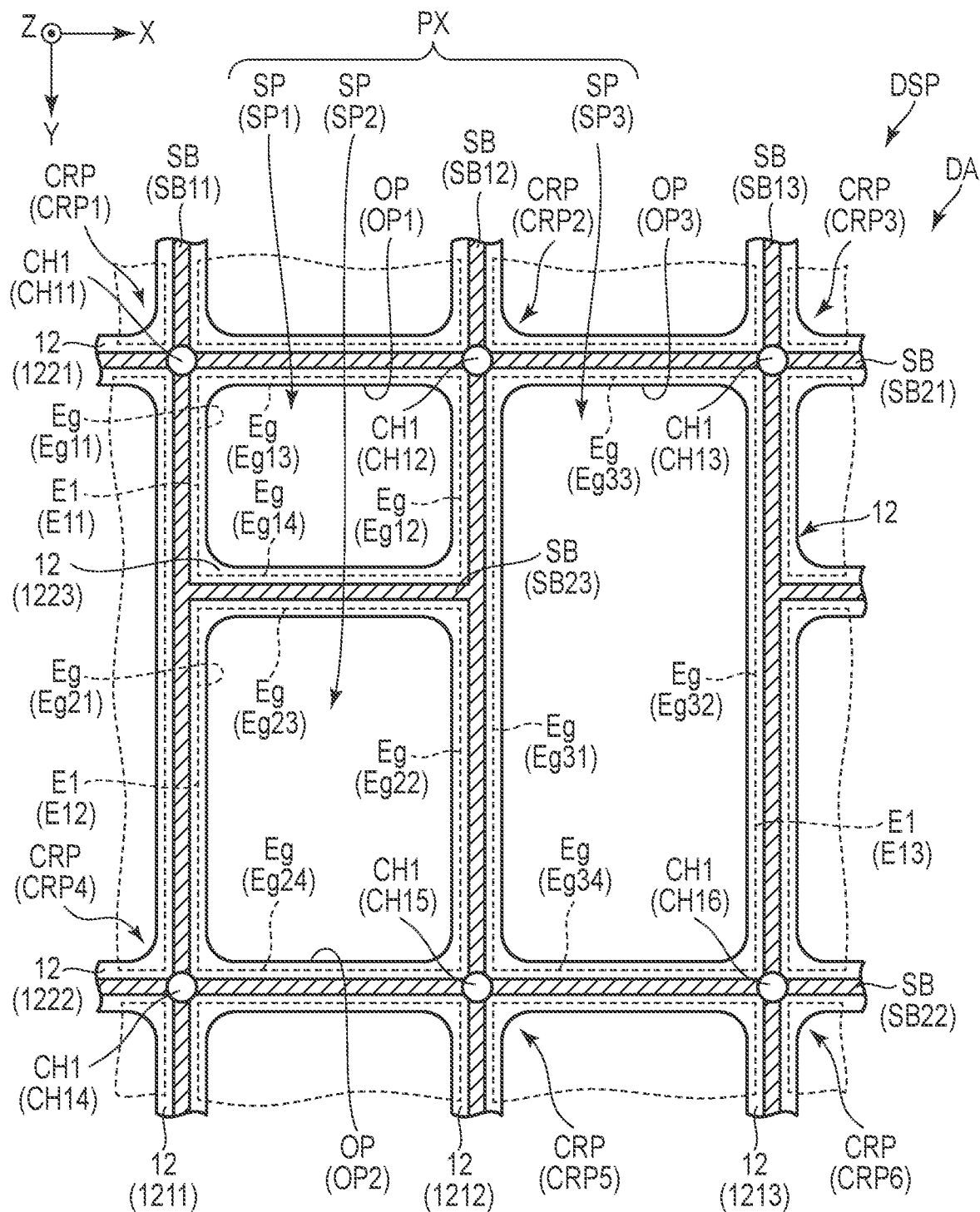
FIG. 2 is a plan view showing a configuration example of a pixel according to the embodiment.

In general, according to one embodiment, a display device comprises: a base; a first insulating layer disposed on the base; a first lower electrode disposed on the first insulating layer; a second lower electrode disposed on the first insulating layer, the second lower electrode being separated from the first lower electrode and being formed of the same material as the first lower electrode; a first wiring disposed between the first lower electrode and the second lower electrode; a second insulating layer disposed on the first wiring; a first organic layer disposed on the first lower electrode and including a first light-emitting layer; a second organic layer disposed on the second lower electrode and including a second light-emitting layer; a first separation wall disposed on the second insulating layer; and an upper wiring disposed continuously on the first organic layer, the second organic layer, and the first separation wall, wherein the upper wiring is electrically connected to the first wiring via a contact hole that penetrates the first separation wall and the second insulating layer.

According to another embodiment, a display device comprises: a base; a first insulating layer disposed on the base; a first lower electrode disposed on the first insulating layer; a second lower electrode disposed on the first insulating layer, the second lower electrode being separated from the first lower electrode, and being formed of the same material as the first lower electrode; a first wiring disposed between the first lower electrode and the second lower electrode; a second insulating layer disposed on the first wiring; a first organic layer disposed on the first lower electrode and including a first light-emitting layer; a second organic layer disposed on the second lower electrode and including a second light-emitting layer; a first upper electrode disposed on the first organic layer; a second upper electrode disposed on the second organic layer; and a separation wall disposed on the second insulating layer, wherein the separation wall separates the first organic layer and the second organic layer, and separates the first upper electrode and the second upper electrode.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Further, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. The first direction X, the second direction Y and the third direction Z may intersect at an angle other than 90 degrees. The length taken along the first direction X or the second direction Y may be referred to as the width, or the length taken along the third direction Z may be referred to as the thickness. In the following descriptions, a direction from a base 10 to a display element 20 may be referred to as "upward" (or simply "up or above") and a direction from the display element 20 to the base 10 may be referred to as "downward" (or simply "down or below").

With such expressions "a second member above a first member" and "a second member below a first member", the second member may be in contact with the first member or may be remote from the first member.

A plane defined by the X axis (the first direction X) and the Y axis (the second direction Y) is referred to as an X-Y plane, a plane defined by the X axis (the first direction X) and the Z axis (the third direction Z) is referred to as an X-Z plane, and a plane defined by the Y axis (the second direction Y) and the sZ axis (the third direction Z) is referred to as a Y-Z plane. Further, viewing towards the X-Y plane is referred to as planar view.

Embodiment

A display device DSP according to the present embodiment is an organic electroluminescent display device comprising an organic light-emitting diode (OLED) as a display element, and is installed in TVs, PCs, mobile terminals, mobile phones, etc.

FIG. 1 shows a configuration example of the display device DSP according to the present embodiment.

The display device DSP has an insulating base 10. The base 10 may be glass or a flexible resin film. The display device DSP also has a display area DA where images are displayed and a non-display area NDA around the display area DA.

In the display area DA, the display device DSP comprises a plurality of pixels PX arranged in a matrix in a first direction X and a second direction Y. The pixel PX comprises a plurality of sub-pixels SP1, SP2, and SP3. In one example, the pixel PX comprises a red sub-pixel SP1, a green sub-pixel SP2, and a blue sub-pixel SP3. In addition to the sub-pixels of the above three colors, the pixel PX may comprise four or more sub-pixels of other colors, such as white.

One configuration example of one sub-pixel SP included in the pixel PX will be briefly explained.

That is, the sub-pixel SP comprises a pixel circuit 1 and a display element 20 that is driven and controlled by the pixel circuit 1. The pixel circuit 1 comprises a pixel switch 2, a drive transistor 3, and a capacitor 4. The pixel switch 2 and the drive transistor 3 are switching elements configured by, for example, thin-film transistors.

As for the pixel switch 2, a gate electrode is connected to a scanning line GL, a source electrode is connected to a signal line SL, and a drain electrode is connected to one of the electrodes that configure the capacitor 4 and a gate electrode of the drive transistor 3. As for the drive transistor 3, a source electrode is connected to the other electrode configuring the capacitor 4 and a power line PL, and a drain electrode is connected to an anode of the display element 20. A cathode of the display element 20 is connected to a power supply line FL. Note that the configuration of the pixel circuit 1 is not limited to the illustrated example.

The display element 20 is an organic light-emitting diode (OLED), which is a light-emitting element. For example, the sub-pixel SP1 comprises a display element that emits light corresponding to a red wavelength, the sub-pixel SP2 comprises a display element that emits light corresponding to a green wavelength, and the sub-pixel SP3 comprises a display element that emits light corresponding to a blue wavelength. Note that the sub-pixels SP1 to SP3 may also comprise display elements that emit light corresponding to a white wavelength. In a case where the light emitting color of each display element 20 is white, a multi-color display can be realized by disposing a color filter opposite the display element 20. In a case where the light emitting color of each display element 20 is an ultraviolet light, a multi-color display can be realized by disposing an optical conversion layer opposite the display element 20. The configuration of the display element 20 will be described later.

FIG. 2 shows a plan view of a configuration example of a pixel PX according to the present embodiment. FIG. 2 shows only the configuration necessary for explanation.

The display device DSP comprises an insulating layer 12, a lower electrode E1, and a separation wall SB, etc. In the example shown in FIG. 2, the display device DSP comprises the insulating layer 12 (1211, 1212, 1213, 1221, 1222, and 1223), the lower electrode E1 (E11, E12, and E13), and the separation wall SB (SB11, SB12, SB13, SB21, SB22, and SB23), etc.

The lower electrode E1 is disposed in the sub-pixel SP. In the example shown in FIG. 2, the lower electrode E1 includes the lower electrodes E11, E12, and E13. The lower electrode E11 is disposed in the sub-pixel SP1. The lower electrode E12 is disposed in the sub-pixel SP2. The lower electrode E13 is disposed in the sub-pixel SP3. The lower electrodes E11 and E12 are aligned in the second direction Y. The lower electrodes E11 and E12 and the lower electrode E13 are aligned in the first direction X. The lower electrodes, including the lower electrodes E11 to E13, are electrodes disposed for each sub-pixel or display element, and may be referred to as pixel electrodes, anodes, etc.

The lower electrode E1 is formed in a rectangular shape in planar view. In this case, the lower electrode E1 has four edges Eg. In the example shown in FIG. 2, the lower electrodes E11 to 513 are formed in a square shape (or a rectangular shape), respectively. The lower electrode E11 is formed in a rectangular shape that is longer in the first direction X than in the second direction Y. The lower electrode E11 has an edge Eg (Eg11) on an opposite side of a distal end side of an arrow in the first direction X, an edge Eg (Eg12) on the distal end side of the arrow in the first direction X, an edge Eg (Eg13) on an opposite side of a distal end side in the second direction Y, and an edge Eg (Eg14) on the distal end side of the second direction Y. The lower electrode E12 is formed in a rectangular shape that is longer in the second direction Y than in the first direction X. The lower electrode E12 has an edge Eg (Eg21) on the opposite side of the distal end side of the arrow in the first direction X, an edge Eg (Eg22) on the distal end side of the arrow in the first direction, an edge Eg (Eg23) on the opposite side of the distal end side in the second direction Y, and an edge Eg (Eg24) on the distal end side of the second direction Y. The lower electrode E13 is formed in a rectangular shape that is longer in the second direction Y than in the first direction X. The lower electrode E13 has an edge Eg (Eg31) on the opposite side of the distal end side of the arrow in the first direction X, an edge Eg (Eg32) on the distal end side of the arrow in the first direction X, an edge Eg (Eg33) on the opposite side of the distal end side in the second direction Y, and an edge Eg (Eg34) on the distal end side of the second direction Y. Note that the lower electrode E1 may be formed in a shape other than a square shape (or a rectangular shape) in planar view.

The insulating layer 12 is formed in a lattice shape in planar view. The insulating layer 12 is formed in such a way that it partitions the display elements or sub-pixels, and may be referred to as banks, ribs, barrier walls, etc. In the example shown in FIG. 2, the insulating layer 12 includes insulating layers (banks) 1211, 1212, 1213, 1221, 1222, and 1223. The insulating layers 1211, 1212, and 1213 extend in the second direction Y. The insulating layers 1211 to 1213 are arranged at intervals in the first direction X. The insulating layers 1211, 1212, and 1213 are lined up in the described order toward the distal end side of the arrow in the first direction X. The insulating layers 1221, 1222, and 1223 extend in the first direction X. The length of the insulating layer 1223 in the first direction X is shorter than the lengths of the insulating layers 1221 and 1222 in the first direction X. For example, the length of the insulating layer 1223 in the first direction X corresponds to an interval between the insulating layers 1211 and 1212 in the first direction X. The insulating layers 1221 to 1223 are arranged at intervals in the second direction Y. For example, the insulating layers 1221, 1223, and 1222 are lined up in the described order toward the distal end side of the arrow in the second direction Y. The insulating layers 1211 to 1213 intersect with the insulating layers 1221 and 1222, respectively. The insulating layers 1211 and 1212 intersect with the insulating layer 1223.

The insulating layer 12 has an opening OP superposed on the lower electrode E1. In the example shown in FIG. 2, the insulating layer 12 has an opening OP1 superposed on the lower electrode E11, an opening OP2 superposed on the lower electrode E12, and an opening OP3 superposed on the lower electrode E13. The opening OP1 corresponds to an area surrounded by the insulating layers 1211 and 1212 and the insulating layers 1221 and 1223. In other words, the center portion of the lower electrode E11 superposed on the opening OP1 is exposed from the insulating layer 12. In addition, the corners of the opening OP1 are rounded (or have an R). Note that the corners of the opening OP1 need not be rounded, and may intersect at right angles. The opening OP2 corresponds to an area surrounded by the insulating layers 1211 and 1212 and the insulating layers 1223 and 1222. In other words, the center portion of the lower electrode E12 superposed on the opening OP2 is exposed from the insulating layer 12. In addition, the corners of the opening OP2 are rounded (or have an R). Note that the corners of the opening OP2 need not be rounded, and may intersect at right angles. The opening OP3 corresponds to an area surrounded by the insulating layers 1212 and 1213 and the insulating layers 1221 and 1222. In other words, the center portion of the lower electrode E13 superposed on the opening OP3 is exposed from the insulating layer 12. In addition, the corners of the opening OP3 are rounded (or have an R). Note that the corners of the opening OP3 need not be rounded, and may intersect at right angles.

In the example shown in FIG. 2, the insulating layer 12 covers the peripheral edge of each of the lower electrodes E11 to E13. The insulating layer 1221 is superposed on the edge Eg11 of lower electrode E11 and the edge Eg33 of lower electrode E13. The insulating layer 1222 is superposed on the edge Eg24 of the lower electrode E12 and the edge Eg34 of the lower electrode E13. The insulating layer 1223 is superposed on the edge Eg14 of the lower electrode E11 and the edge Eg23 of the lower electrode E12. The insulating layer 1211 is superposed on the edge Eg11 of the lower electrode E11 and the edge Eg21 of the lower electrode. The insulating layer 1212 is superposed on the edge Eg12 of the lower electrode E11, the edge Eg22 of the lower electrode E12, and the edge Eg31 of the lower electrode E13. The insulating layer 1213 is superposed on the edge Eg32 of the lower electrode E13.

The separation wall SB is superposed on the insulating layer 12. For example, the separation wall SB is disposed in a lattice shape to be superposed on the insulating layer 12 in planar view. For example, the separation wall SB is not superposed on the lower electrode E1 in planar view. The separation wall SB may be superposed on the lower electrode E1.

In the example shown in FIG. 2, the separation wall SB includes separation walls SB11, SB12, SB13, SB21, SB22, and SB23. The separation walls SB11, SB12, and SB13 extend in the second direction Y. The separation walls SB11 to SB13 are arranged at intervals in the first direction X. For example, the separation walls SB11, SB12, and SB13 are lined up in the described order toward the distal end side of the arrow in the first direction X. The separation walls SB21, SB22, and SB23 extend in the first direction X. The length of the separation wall SB23 in the first direction X is shorter than the lengths of the separation walls SB21 and SB22. For example, the length of the separation wall SB23 in the first direction X corresponds to an interval between the separation walls SB11 and SB12 in the first direction X. The separation walls SB21 to SB23 are arranged at intervals in the second direction Y. For example, the separation walls SB21, SB23, and SB22 are lined up in the described order toward the distal end side of the arrow in the second direction Y. The separation walls SB11 to SB13 intersect with the separation walls SB21 and SB22, respectively. The separation walls SB11 and SB12 intersect with the separation wall SB23.

In the example shown in FIG. 2, the separation wall SB11 is superposed on the insulating layer 1211, the separation wall SB12 is superposed on the insulating layer 1212, and the separation wall SB13 is superposed on the insulating layer 1213. The separation wall SB21 is superposed on the insulating layer 1221, the separation wall SB22 is superposed on the insulating layer 1222, and the separation wall SB23 is superposed on the insulating layer 1223. The separation walls SB11 to SB13 and the separation walls SB21 to SB23 are not superposed on the lower electrode E1. Note that the separation walls SB11 to SB13 and the separation walls SB21 to SB23 may also be superposed on the lower electrode E1.

On the separation wall SB and the insulating layer 12, a contact hole CH1 is formed at a portion (hereinafter referred to as an intersection) CRP where the portion extending in the first direction X and the portion extending in the section direction Y intersect. In the separation wall SB and the insulating layer 12, contact holes CH1 may be formed in all the intersections CRP or in some of the intersections CRP. Note that at least one contact hole CH1 is to be formed in one pixel PX. The corners of the intersection CRP has R.

In the example shown in FIG. 2, the separation wall SB and the insulating layer 12 include an intersection CRP1 where the separation wall SB11 and the insulation layer 1211 intersect with the separation wall SB21 and the insulating layer 1221, an intersection CRP2 where the separation wall SB12 and the insulating layer 1212 intersect with the separation wall SB21 and the insulating layer 1221, an intersection CRP3 where the separation wall SB13 and the insulating layer 1213 intersect with the separation wall SB21 and the insulating layer 1221, an intersection CRP4 where the separation wall SB11 and the insulating layer 1211 intersect with the separation wall SB22 and the insulating layer 1222, an intersection CRP5 where the separation wall SB12 and the insulating layer 1212 intersect with the separation wall SB22 and the insulating layer 1222, and an intersection CRP6 where the separation wall SB13 and the insulating layer 1213 intersect with the separation wall SB22 and the insulating layer 1222. In the intersection CRP1, a contact hole CH11 is formed. In the intersection CRP2, a contact hole CH12 is formed. In the intersection CRP3, a contact hole CH13 is formed. In the intersection CRP4, a contact hole CH14 is formed. In the intersection CRP5 a contact hole CH15 is formed. In the intersection CRP6, a contact hole CH16 is formed.

Here, the outline of the sub-pixel SP corresponds to, for example, the outline of the lower electrode E1. In other words, the sub-pixels SP1, SP2, and SP3 that configure a single pixel PX are each formed in a square shape (or a rectangular shape). The sub-pixel SP1 is formed in approximately a rectangular shape extending in the first direction X, the sub-pixel SP2 is formed in approximately a rectangular shape extending in the second direction Y, and the sub-pixel SP3 is formed in approximately a rectangular shape extending in the second direction Y. The sub-pixels SP1 and SP2 are aligned in the second direction Y. The sub-pixels SP1 and SP2 and the sub-pixel SP3 are aligned in the first direction X. The light emitting colors of adjacent sub-pixels lined up in the first direction X are different from each other. Note that the light emitting colors of the adjacent sub-pixels may also be the same. The width of the sub-pixel SP1 in the first direction X is the same as the width of the sub-pixel SP2 in the first direction X. The width of the sub-pixel SP3 in the second direction Y is almost the same as the sum of the width of the sub-pixel SP1 in the second direction Y and the width of the sub-pixel SP2 in the second direction Y. The area of each of the sub-pixels SP1 to SP3 is different from each other. The area of the sub-pixel SP2 is, for example, larger than the area of the sub-pixel SP1, and the area of the sub-pixel SP3 is, for example, larger than the area of the sub-pixel SP2. Note that the area of the sub-pixel SP1 may be the same as the area of the sub-pixel SP2. The outline of the sub-pixel may also be defined by the outline of the light-emitting area of the display element. The terms "same", "identical", and "equivalent" include not only the physical quantity, material, or configuration (structure) of a plurality of target objects, spaces, areas, etc., being exactly the same, but also slight differences to the extent that they can be regarded as being substantially the same.

Figure 3:
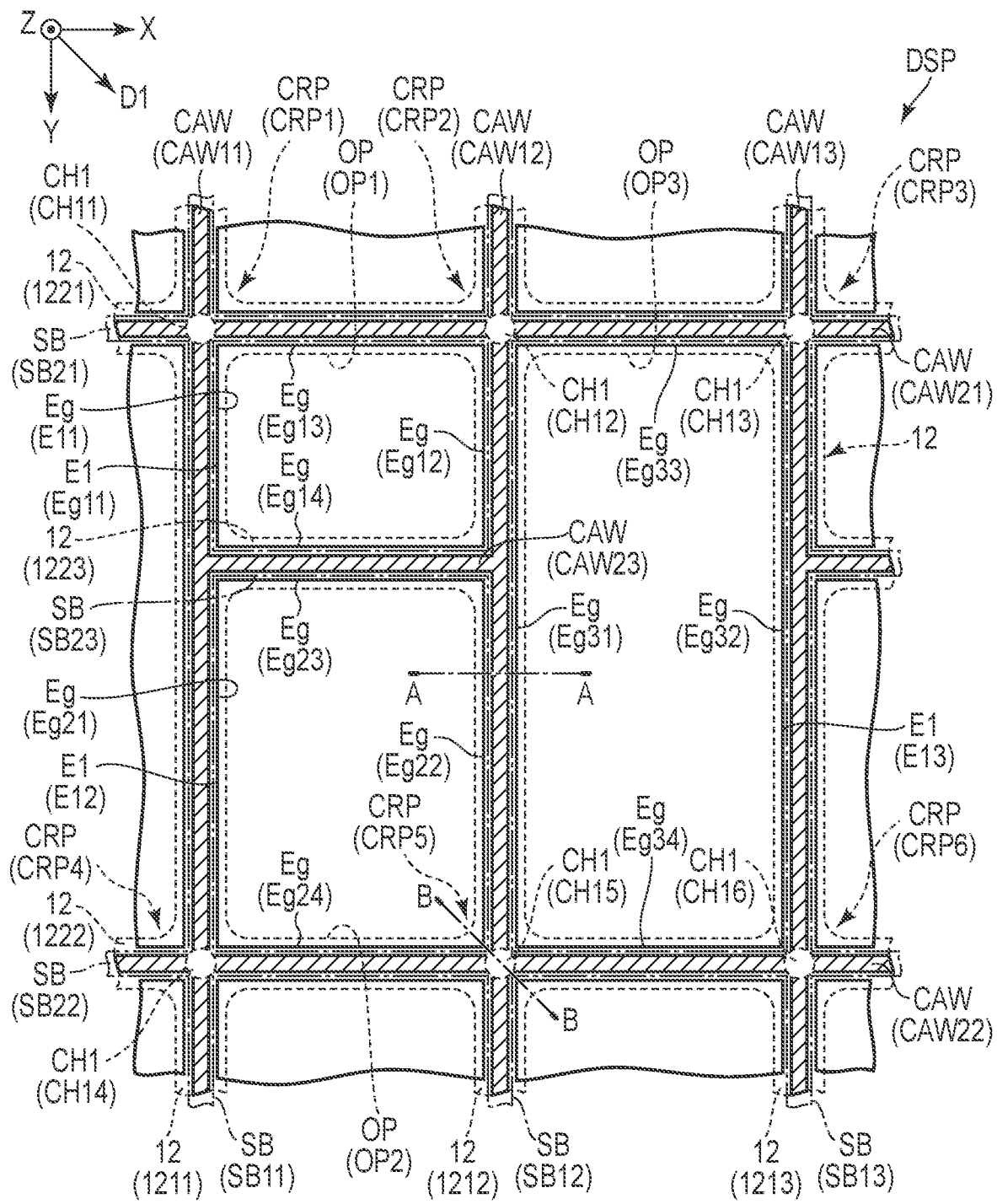
FIG. 3 is a plan view showing a configuration example of an auxiliary wiring according to the embodiment.

FIG. 3 is a plan view showing a configuration example of an auxiliary wiring CAW according to the present embodiment. The configuration shown in FIG. 3 corresponds to the configuration shown in FIG. 2. FIG. 3 shows only the configuration necessary for explanation. FIG. 3 shows a fourth direction D1 indicating a direction between the first direction X and the second direction Y in an X-Y plane. The fourth direction D1 is orthogonal to a third direction Z. The fourth direction D1 may intersect the third direction Z at an angle other than 90 degrees. The length of the fourth direction D1 may be referred to as the width.

The display device DSP comprises the auxiliary wiring CAW and other components. In the example shown in FIG. 3, the display device DSP comprises the insulating layer 12 (1211, 1212, 1213, 1221, 1222, and 1223), the lower electrode E1 (E11, E12, and E13), the separation wall SB (SB11, SB12, SB13, SB21, SB22, and SB23), and the auxiliary wiring CAW (CAW11, CAW12, CAW 13, CAW21, CAW22, and CAW23), etc.

The auxiliary wiring CAW is superposed on the insulating layer 12. For example, the auxiliary wiring CAW is disposed in a lattice shape to be superposed on the insulating layer 12 in planar view. The auxiliary wiring CAW is also superposed on the separation wall SB. For example, the auxiliary wiring CAW is disposed in a lattice shape to be superposed on the separation wall SB in planar view. For example, the auxiliary wiring CAW is not superposed on the lower electrode E1 in planar view. The auxiliary wiring CAW is connected to a predetermined wiring. For example, the auxiliary wiring CAW may be connected to a power supply wiring. Note that the auxiliary wiring CAW does not have to be disposed in a lattice shape.

In the example shown in FIG. 3, the auxiliary wiring CAW includes auxiliary wirings CAW11, CAW12, CAW 13, CAW21, CAW22, and CAW23. The auxiliary wirings CAW11, CAW12, and CAW13 extend in the second direction Y. The auxiliary wirings CAW11 to CAW13 are arranged at intervals in the first direction X. For example, the auxiliary wirings CAW11, CAW12, and CAW13 are lined up in the described order toward the distal end side of the arrow in the first direction X. The auxiliary wirings CAW21, CAW22, and CA23 extend in the first direction X. The length of the auxiliary wiring CAW23 in the first direction X is shorter than the lengths of auxiliary wirings CAW21 and CAW22 in the first direction X. For example, the length of the auxiliary wiring CAW23 in the first direction X corresponds to an interval between the auxiliary wirings CAW11 and CAW12 in the first direction X. For example, the auxiliary wirings CAW21, CAW23, and CAW22 are lined up in the described order toward the distal end side of the arrow in the second direction Y. The auxiliary wirings CAW11 to CAW13 intersect with the auxiliary wirings CAW21 and CAW22, respectively. The auxiliary wirings CAW11 and CAW12 intersect with the auxiliary wiring CAW23.

In the example shown in FIG. 3, the auxiliary wiring CAW11 is superposed on the insulating layer 1211, the auxiliary wiring CAW12 is superposed on the insulating layer 1212, and the auxiliary wiring CAW13 is superposed on the insulating layer 1213. The auxiliary wiring CAW21 is superposed on the insulating layer 1221, the auxiliary wiring CAW22 is superposed on the insulating layer 1222, and the auxiliary wiring CAW23 is superposed on the insulating layer 1223. The auxiliary wirings CAW11 to CAW13 and the auxiliary wirings CAW21 to CAW23 are not superposed on the lower electrode E1. Note that the auxiliary wirings CAW11 to CAW13 and the auxiliary wirings CAW21 to CAW 23 may also be superposed on the lower electrode E1.

In the example shown in FIG. 3, the auxiliary wiring CAW11 is superposed on the separation wall SB11, the auxiliary wiring CAW12 is superposed on the separation wall SB12, and the auxiliary wiring CAW13 is superposed on separation wall SB13. Note that the auxiliary wiring CAW11 does not have to be superposed on the separation wall SB11, the auxiliary wiring CAW12 does not have to be superposed on the separation wall SB12, and the auxiliary wiring CAW13 does not have to be superposed on the separation wall SB13. The auxiliary wiring CAW21 is superposed on the separation wall SB21, the auxiliary wiring CAW22 is superposed on the separation wall SB22, and the auxiliary wiring CAW23 is superposed on the separation wall SB23. Note that the auxiliary wiring CAW21 does not have to be superposed on the separation wall SB21, the auxiliary wiring CAW22 does not have to be superposed on the separation wall SB22, and the auxiliary wiring CAW23 does not have to be superposed on the separation wall SB23.

Figure 4:
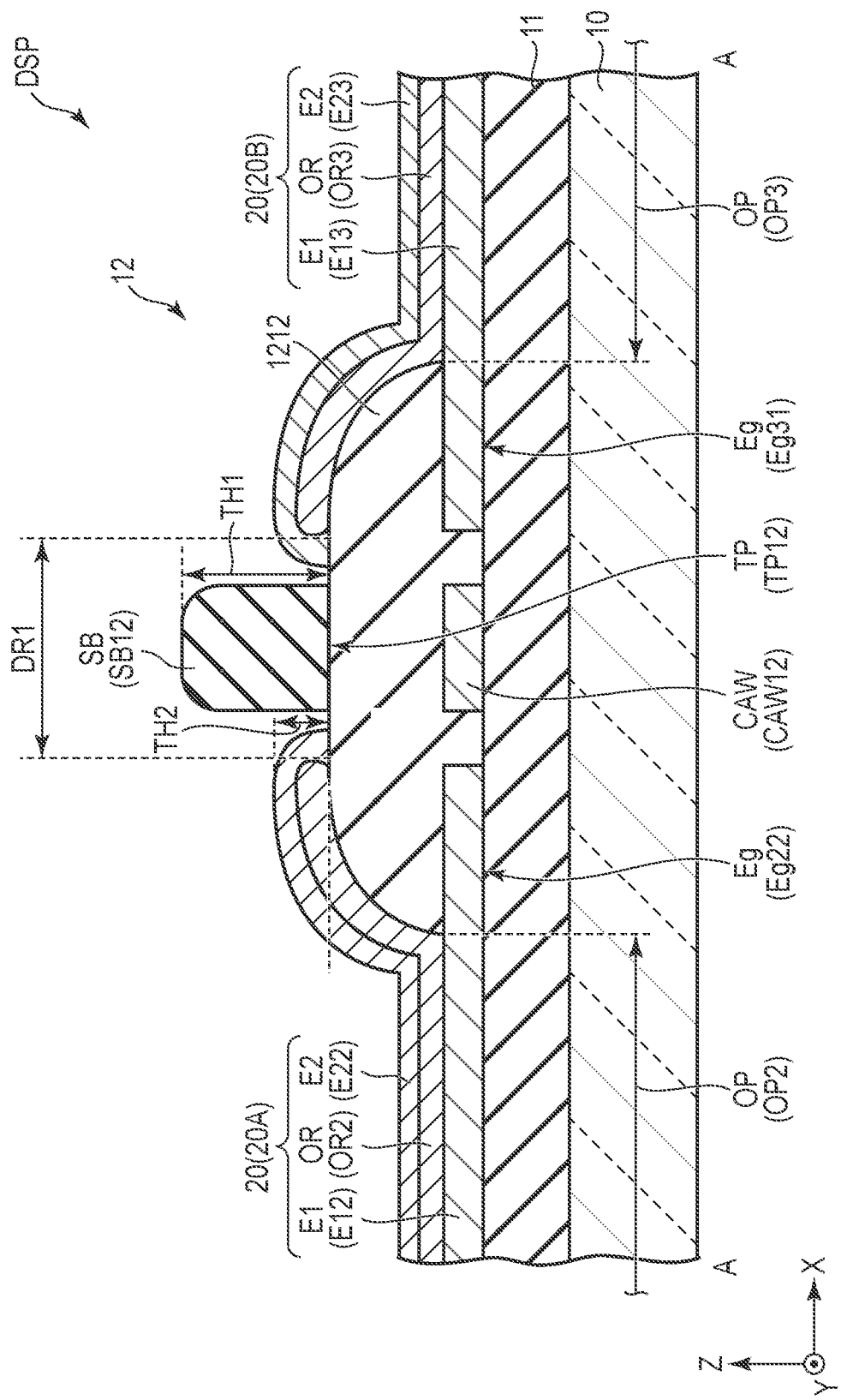
FIG. 4 is a cross-sectional view showing a configuration example of the display device cut along an A-A line shown in FIG. 3.

FIG. 4 is a cross-sectional view of the display device DSP cut along an A-A line shown in FIG. 3. Note that FIG. 4 shows only the main part of the display device DSP.

The display device DSP comprises the base 10, an insulating layer 11, the lower electrode E1 (E12 and E13), the auxiliary wiring CAW (CAW12), the insulating layer 12 (1212), an organic layer OR (OR2 and OR3), an upper electrode E2 (E22 and E23), and the separation wall SB (SB12). The display device DSP includes the display element 20. The display element 20 (20A and 20B) is configured by the lower electrode E1 (E12 and E13), the organic layer OR (OR2 and OR3), and the upper electrode E2 (E22 and E23).

In the example shown in FIG. 4, the display element 20 includes the display elements 20A and 20B. The display element 20A is configured by the lower electrode E12, the organic layer OR2, and the upper electrode E22. The display element 20B is configured by the lower electrode E13, the organic layer OR3, and the upper electrode E23.

The insulating layer 11 is disposed on the base 10. The insulating layer 11 corresponds to a base layer of the display element 20 and is, for example, an organic insulating layer. Note that, although the pixel switch 2, etc., of the pixel circuit 1 shown in FIG. 1 are disposed on the base 10 and covered by an insulating layer, for example, insulating layer 11, here, the illustration thereof is omitted. In the example shown in FIG. 4, the insulating layer 11 corresponds to the base layer of the display elements 20A and 20B. Note that the insulating layer 11 may be formed in a single layer or in a plurality of layers. In addition, other layers may be disposed between the base 10 and the insulating layer 11.

The lower electrode E1 is disposed on the insulating layer 11. In the example shown in FIG. 4, the lower electrode E1 includes the lower electrodes E12 and E13. The lower electrodes E12 and E13 are disposed on the insulating layer 11. A plurality of lower electrodes E1 are arranged at intervals in the first direction X. In the example shown in FIG. 4, the edge Eg22 of the lower electrode E12 and the edge Eg31 of the lower electrode E13 are arranged with a gap (or an interval) in the first direction X. Although not shown, the lower electrode E1 may be electrically connected to the switching element via a contact hole formed in the insulating layer 11. For example, although not shown, the lower electrode E12 may be electrically connected to the switching element via the contact hole formed in the insulating layer 11. For example, although not shown, the lower electrode E13 may be electrically connected to the switching element via the contact hole formed in the insulating layer 11. Note that other layers may also be disposed between the lower electrode E1 and the insulating layer 11.

The lower electrodes E1 (E12 and E13) are transparent electrodes formed by a transparent conductive material such as indium tin oxide (ITO) or indium zinc oxide (IZO). Note that the lower electrode E1 may be a metal electrode formed by a metallic material such as silver or aluminum. The lower electrode E1 may also be a stacked body of transparent and metal electrodes. For example, the lower electrode E1 may be configured by a single layer, a stacked body in which a transparent electrode, a metal electrode, and a transparent electrode are stacked in the described order, or a stacked body including three or more layers.

The auxiliary wiring CAW is disposed on the insulating layer 11. Note that the auxiliary wiring CAW may also be disposed on a layer other than the insulating layer 11. In the example shown in FIG. 4, the auxiliary wiring CAW includes the auxiliary wiring CAW12. The auxiliary wiring CAW12 is disposed on the insulating layer 11. The auxiliary wiring CAW12 is disposed on the same layer as the lower electrodes E12 and E13. Note that the auxiliary wiring CAW12 may also be disposed on a layer other than the insulating layer 11. In other words, the auxiliary wiring CAW12 may be disposed on a different layer from the lower electrodes E12 and E13. For example, in a case where the auxiliary wiring CAW12 is disposed in a layer below the lower electrodes E12 and E13, the auxiliary wiring CAW12 may be disposed at a position superposing the display element 20.

The auxiliary wiring CAW is disposed between two adjacent lower electrodes E1. In the example shown in FIG. 4, the auxiliary wiring CAW12 is disposed between the lower electrodes E12 and E13 in the first direction X. The auxiliary wiring CAW12 is, for example, separated from the edge Eg22 of the lower electrode E12 by a gap on the distal end side in the first direction X and from the edge Eg31 of the lower electrode E13 by a gap on the opposite side of the distal end side of the arrow in the first direction X. Note that the auxiliary wiring CAW12 may also be disposed at the center of the interval between the lower electrodes E12 and E13 in the first direction X, or off the center of the interval between the lower electrodes E12 and E13 in the first direction X.

The auxiliary wiring CAW is formed, for example, by metal wiring. The auxiliary wiring CAW may be formed, for example, by low-resistance metal wiring. The auxiliary wiring CAW inputs a potential (cathode potential) to the upper electrode E2. The auxiliary wiring CAW can also be used, for example, to assist in lowering resistance of a layer with high electrical resistance that includes a transparent conductive material such as indium tin oxide (ITO) or indium zinc oxide (IZO).

The auxiliary wiring CAW is configured by, for example, a stacked body. The auxiliary wiring CAW is formed by three layers of metal film, such as titanium (Ti)/aluminum (Al)/titanium (Ti). Note that the auxiliary wiring CAW may also be configured by a single layer. In addition, the auxiliary wiring CAW may also be formed with materials other than titanium (Ti)/aluminum (Al)/titanium (Ti).

For example, the auxiliary wiring CAW may include a transparent electrode formed by a transparent conductive material such as indium tin oxide (ITO) or indium zinc oxide (IZO). For example, the auxiliary wiring CAW may include the same material as the lower electrode E1.

The insulating layer 12 is disposed on the insulating layer 11, the lower electrode E1, and the auxiliary wiring CAW. The insulating layer 12 is, for example, an organic insulating layer. The insulating layer 12 has an opening OP (OP2 and OP3). The opening OP is formed on the lower electrode E1. The opening OP is formed by penetrating the insulating layer 12 to the lower electrode E1. In the example shown in FIG. 4, the insulating layer 12 has an opening OP2, an opening OP3, and a bank 1212. The opening OP2 is formed above the lower electrode E12. The opening OP3 is formed above the lower electrode E13. The bank 1212 is located above the insulating layer 11, the edge Eg22 of the lower electrode E12, the edge Eg31 of lower electrode E13, and the auxiliary wiring CAW12. In other words, the bank 1212 is superposed on (or facing) the auxiliary wiring CAW12. The bank 1212 has, for example, a top TP (TP12). The top TP (TP12) corresponds to the top portion of the bank 1212 and may be flat or curved. The bank 1212 may have, for example, a surface curved from the opening OP2 to the top TP12 and a surface curved from the opening OP3 to the top TP12. The thickness of the bank 1212 corresponds to a distance between the highest point of the bank 1212, e.g., the top TP12, and the insulating layer 11. The thickness of the bank 1212 is several μm, for example, 1.5 to 2.0 μm.

The organic layer OR is disposed on the lower electrode E1 and the insulating layer 12. In the example shown in FIG. 4, the organic layer OR includes an organic layer OR2 and an organic layer OR3. The organic layer OR2 is disposed on the lower electrode E12 corresponding to the opening OP2 and on the bank 1212. On the bank 1212, the organic layer OR2 is disposed on a surface that curves from the lower electrode E12 corresponding to the opening OP2 to the top TP12. The organic layer OR3 is disposed on the lower electrode E13 corresponding to the opening OP3 and on the bank 1212. On the bank 1212, the organic layer OR3 is disposed on a surface that curves from the lower electrode E13 corresponding to the opening OP3 to the top TP12. The organic layers OR2 and OR3 are not in contact with each other. In other words, the organic layers OR2 and OR3 are divided. That is, the organic layer OR2 is separated from the organic layer OR3. For example, the organic layer OR2 and the organic layer OR3 are separated by a distance DR1 in the first direction X. The organic layer OR2 is not in contact with the separation wall SB (described later), e.g., the edge of the separation wall SB12 opposite to the distal end side of the arrow in the first direction X. In other words, the organic layer OR2 is separated from the separation wall SB (described later), e.g., the edge of the separation wall SB12 opposite to the distal end side of the arrow in the first direction X. For example, the edge of the organic layer OR2 is located at the top TP on the bank 1212. Note that the organic layer OR2 may also be in contact with the edge of the separation wall SB12 opposite to the distal end side of the arrow in the first direction X. The organic layer OR3 is not in contact with the separation wall SB (described later), e.g., the edge of the separation wall SB12 on the distal end side of the arrow in the first direction X. In other words, the organic layer OR3 is separated from the separation wall SB (described later), e.g., the edge of the separation wall SB12 on the distal end side of the arrow in the first direction X. For example, the edge of the organic layer OR3 is located at the top TP on the bank 1212. Note that the organic layer OR3 may also be in contact with the edge of the separation wall SB12 on the distal end side of the arrow in the first direction X.

The organic layer OR includes a light-emitting layer that emits light by the magnitude of a current that flows by applying a predetermined voltage between the lower electrode E1 and the upper electrode E2. In addition to the light-emitting layer, the organic layer OR includes at least one of a hole injection layer, a hole transport layer, an electron injection layer, and an electron transport layer. For example, the organic layers OR2 and OR3 include light-emitting layers of different colors. Note that the organic layers OR2 and OR3 may also include light-emitting layers of the same color.

The upper electrode E2 is disposed on the organic layer OR and the bank 1212. Note that the upper electrode E2 does not have to be disposed on the bank 1212. The upper electrode E2 covers the organic layer OR. Note that the upper electrode E2 may also cover the bank 1212. In the example shown in FIG. 4, the upper electrode E2 includes upper electrodes E22 and E23. The upper electrode E22 is disposed on the organic layer OR2 and bank 1212. The upper electrode E22 covers the organic layer OR2. The upper electrode E22 is in contact with the bank 1212. The upper electrode E22 is separated from the separation wall SB (described later), e.g., the edge of the separation wall SB12 opposite to the distal end side of the arrow in the first direction X. In other words, the upper electrode E22 is not in contact with the edge of the separation wall SB12 opposite to the distal end side of the arrow in the first direction X. Note that the upper electrode E22 may also cover the bank 1212. The upper electrode E22 may also be in contact with the separation wall SB (described later), e.g., the edge of the separation wall SB12 opposite to the distal end side of the arrow in the first direction X. The upper electrode E23 is disposed on the organic layer OR3 and the bank 1212. The upper electrode E23 covers the organic layer OR3. The upper electrode E23 is in contact with the bank 1212. The upper electrode E23 is separated from the separation wall SB (described later), e.g., the edge of the separation wall SB12 on the distal end side of the arrow in the first direction X. In other words, the upper electrode E23 is not in contact with the edge of the separation wall SB12 on the distal end side of the arrow in the first direction X. Note that the upper electrode E23 may also cover the bank 1212. The upper electrode E23 may also be in contact with the separation wall SB (described later), e.g., the edge of the separation wall SB12 on the distal end side of the arrow in the first direction X.

The upper electrode E2 is a transparent electrode formed by a transparent conductive material such as ITO or IZO. The upper electrode E2 is an electrode commonly arranged for a plurality of sub-pixels or a plurality of display elements, and may be referred to as a common electrode, counter electrode, or cathode. Note that the upper electrode E2 may be covered by a transparent protective layer (including at least one of an inorganic insulating layer and an organic insulating layer). The upper electrode E2 may be configured by a single layer or as a stacked body. Note that the upper electrode E2 may also be electrically connected to the power supply line FL located in the display area DA shown in FIG. 1.

The separation wall SB is disposed on the insulating layer 12. In the example shown in FIG. 4, the separation wall SB includes the separation wall SB12. The separation wall SB12 is disposed on the bank 1212. For example, the separation wall SB12 is disposed on the top TP12 of the bank 1212. The separation wall SB12 is, for example, superposed on the auxiliary wiring CAW12. In other words, the separation wall SB12 faces the auxiliary wiring CAW12. Note that the separation wall SB12 does not have to be superposed on the auxiliary wiring CAW12. In other words, the separation wall SB12 does not have to face the auxiliary wiring CAW12.

The separation wall SB is disposed between two adjacent organic layers OR. The separation wall SB is also disposed between two adjacent upper electrodes E2. In the example shown in FIG. 4, the separation wall SB12 is disposed between the organic layers OR2 and OR3. Also, the separation wall SB12 is disposed between the upper electrode E22 and the upper electrode E23.

The separation wall SB separates (or divides) the two adjacent organic layers OR. The separation wall SB also separates (or divides) the two adjacent upper electrodes E2. In the example shown in FIG. 4, the separation wall SB12 separates (or divides) the organic layer OR2 and the organic layer OR3. Also, the separation wall SB12 separates (or divides) the adjacent upper electrode E22 and upper electrode E23. Note that the separation wall SB12 does not have to separate the adjacent upper electrode E22 and the upper electrode E23.

The separation wall SB is formed by an organic insulating layer. For example, the separation wall SB may be formed of the same material as the insulating layer 12. Note that the separation wall SB may also be formed of a material different from the insulating layer 12. The separation wall SB may be formed by stacking a plurality of layers or may be a single layer. Note that the separation wall SB may be formed separately from the bank 1212 or may be formed integrally with the bank 1212. A thickness TH1 of the separation wall SB is thicker than a thickness TH2 obtained by stacking the organic layer OR and the upper electrode E2. In other words, the thickness TH2 is smaller than the thickness TH1. For example, the thickness TH1 of the separation wall SB is several tens of nm (nanometers). In the example shown in FIG. 4, the thickness TH1 of the separation wall SB corresponds to the height from the top TP12 of the bank 1212 to the top of the separation wall SB. The width of the separation wall SB in the first direction X is, for example, smaller than the distance DR1. The width of the separation wall SB in the first direction X is, for example, equal to or smaller than the distance between the upper electrodes E22 and E23. Furthermore, the width of the separation wall SB in the first direction X may be the same as or different from the width of the auxiliary wiring CAW in the first direction X.

The shape of the cross section of the separation wall SB is approximately a rectangular shape. In the example shown in FIG. 4, the top corners of the cross section of the separation wall SB are rounded. Note that the top corners of the cross section of the separation wall SB do not have to be rounded. The shape of the cross section of the separation wall SB may also be a rectangular shape (or a square shape), or may be a shape other than a rectangular shape.

In the display device 20, the organic layer OR is disposed between the lower electrode E1 and the upper electrode E2 to form a light-emitting area. In the example shown in FIG. 4, in the display element 20A, the organic layer OR2 is disposed between the lower electrode E12 and the upper electrode E22 to form the light-emitting area. In display element 20B, the organic layer OR3 is disposed between the lower electrode E13 and the upper electrode E23 to form the light-emitting area. Since the organic layers OR2 and OR3 are completely separated by the separation wall SB12, no leakage path will occur. Furthermore, since the portion of the organic layer OR2 that covers the bank 1212 is located between the bank 1212 and an upper electrode E22 it hardly emits light. Similarly, since the part of the organic layer OR3 that covers the bank 1212 is located between the bank 1212 and the upper electrode E23, it hardly emits light.

In the display device DSP, for example, the organic layer OR is formed by a vacuum deposition method. In the example shown in FIG. 4, the lower electrodes E12 and E13 and the auxiliary wiring CAW12 are formed on the insulating layer 11. After the lower electrodes E12 and E13 and the auxiliary wiring CAW12 are formed, the bank 1212 is formed. After the bank 1212 is formed, the separation wall SB12 is formed on the bank 1212. After the separation wall SB12 is formed on the bank 1212, an organic material for forming the organic layer OR (OR2 and OR3) is deposited. In the example shown in FIG. 4, the organic layers OR2 and OR3 are not in contact with the separation wall SB12. The upper electrode E2 is formed, for example, by a sputtering method. The upper electrode E2 of the adjacent organic layers OR2 and OR3 is removed by patterning to prevent the occurrence of lateral leakage between the adjacent organic layers OR2 and OR3. In the example shown in FIG. 4, the upper electrode E22 is not in contact with the edge of the separation wall SB opposite to the distal end side of the arrow in the first direction X. In other words, the upper electrode E22 is separated from the edge of the separation wall SB21 opposite the distal end side of the arrow in the first direction X. The upper electrode E23 is not in contact with the edge of the separation wall SB12 on the distal end side of the arrow in the first direction X. In other words, the upper electrode E23 is separated from the edge of the separation wall SB12 on the distal end side of the arrow in the first direction X.

Figure 5:
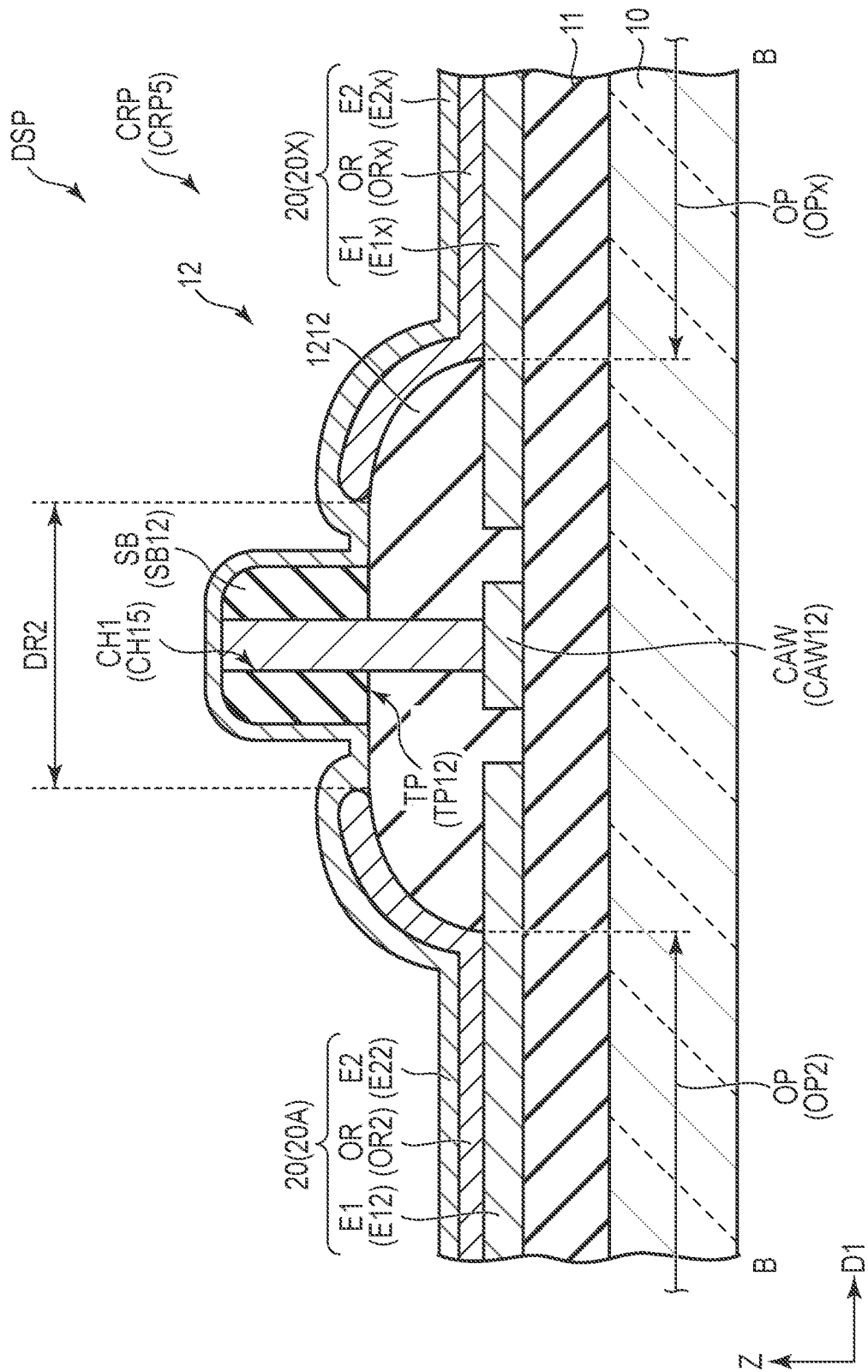
FIG. 5 is a cross-sectional view showing a configuration example of an intersection cut along a B-B line shown in FIG. 3.

FIG. 5 is a cross-sectional view showing a configuration example of the intersection CRP cut along a B-B line shown in FIG. 3. Note that only the main part of the display device DSP (intersection CRP) is shown in FIG. 5.

The intersection CRP (CRP5) comprises the base 10, the insulating layer 11, the lower electrode E1 (E12 and E1x), the auxiliary wiring CAW (CAW12), the insulating layer 12 (1212), the organic layer OR (OR2 and ORx), the upper electrode E2 (E22, and E2x), and the separation wall SB (SB12).

In the example shown in FIG. 5, the display element 20 includes display elements 20A and 20X. The display element 20X is configured by the lower electrode E1x, the organic layer ORx, and the upper electrode E2x.

In the example shown in FIG. 5, the lower electrode E1 includes the lower electrodes E12 and E1x. The lower electrode E12 and the lower electrode E1x are disposed with a gap in the fourth direction D1.

In the example shown in FIG. 5, the organic layer OR includes the organic layer OR2 and the organic layer ORx. The organic layer ORx is disposed on the lower electrode E1x corresponding to an opening OPx and on the bank 1212. On the bank 1212, the organic layer ORx is disposed on a surface that curves from the lower electrode E1x corresponding to the opening OPx to the top TP12. The organic layers OR2 and ORx are not in contact with each other. In other words, the organic layers OR2 and ORx are divided. That is, the organic layer OR2 is separated from the organic layer ORx. For example, the organic layer OR2 and the organic layer ORx are separated by a distance DR2 in the fourth direction D1. Here, for example, the distance DR2 is larger than the distance DR1. As shown in FIG. 5, since the distance DR2 is larger than the distance DR1, the intersection CRP can suppress the lateral leakage that may occur between adjacent organic layers OR without dividing the upper electrode E2. The organic layer OR2 is not in contact with the edge of the separation wall SB12 opposite to the distal end side of the arrow in the fourth direction D1. In other words, the organic layer OR2 is separated from the edge of the separation wall SB12 opposite to the distal end side of the arrow in the fourth direction D1. Note that the organic layer OR2 may be in contact with the edge of the separation wall SB12 opposite to the distal end side of the arrow in the fourth direction D1. The organic layer ORx is not in contact with the edge of the separation wall SB12 on the distal end side of the arrow in the fourth direction D1. In other words, the organic layer ORx is separated from the edge of the separation wall SB12 opposite to the distal end side of the arrow in the fourth direction D1. Note that the organic layer ORx may be in contact with the edge of the separation wall SB12 on the distal end side of the arrow in the fourth direction D1.

The contact hole CH1 (CH15) penetrates the separation wall SB and the insulating layer 12 and reaches the auxiliary wiring CAW. In the example shown in FIG. 5, the contact hole CH15 penetrates the separation wall SB12 and the bank 1212 and reaches the auxiliary wiring CAW12.

The upper electrode E2 is disposed on the organic layer OR, the bank 1212, and the separation wall SB. In other words, the upper electrode E2 covers the organic layer OR, the bank 1212, and the separation wall SB. Note that the upper electrode E2 does not have to cover the bank 1212 and the separation wall SB. In the example shown in FIG. 5, the upper electrode E2 includes the upper electrodes E22 and E2x. The upper electrode E22 is disposed on the organic layer OR2, the bank 1212, and the separation wall SB12. The upper electrode E22 covers the organic layer OR2, the bank 1212, and the separation wall SB12. Note that the upper electrode E22 does not have to cover the bank 1212 and the separation wall SB12. The upper electrode E2x is disposed on the organic layer ORx, the bank 1212, and the separation wall SB12. The upper electrode E2x covers the organic layer ORx, the bank 1212, and the separation wall SB12. Note that the upper electrode E2x does not have to cover the bank 1212 and the separation wall SB12. In the example shown in FIG. 5, the upper electrodes E22 and E2x are connected on the separation wall SB12. The upper electrodes E22 and E2*x* (upper electrode E2) are electrically connected to the auxiliary wiring CAW12 via the contact hole CH1 (CH15).

According to the present embodiment, the display device DSP comprises the base 10, the insulating layer 11, a plurality of lower electrodes E1, the auxiliary wiring CAW, the insulating layer 12, a plurality of organic layers OR, the upper electrode E2, and the separation wall SB. The separation wall SB is disposed on the insulating layer 12. The separation wall SB separates the two organic layers OR and the two upper electrodes E2 adjacent in the first direction X at a portion other than the intersection CRP in the insulating layer 12. The separation wall SB separates the two organic layers OR adjacent in the fourth direction D1 at the intersection CRP. At the intersection CRP, the upper electrode E2 is disposed on the separation wall SB and is electrically connected to the auxiliary wiring CAW via the contact hole CH1 that penetrates the separation wall SB and the insulating layer 12. In the display device DSP, the adjacent organic layers OR and the adjacent upper electrodes E2 are separated by the separation wall to prevent lateral leakage that may occur between the adjacent organic layers OR. The display device DSP can have stable tone characteristics without being affected by the tone of adjacent pixels, etc. Therefore, the display device DSP can improve display quality.

Modified examples of the present embodiment will now be explained with reference to FIG. 6 and FIG. 7, respectively. In the modified examples of the present embodiment described below, the same reference symbols are given to the same parts as described above, and detailed explanations thereof will be omitted to provide explanations in detail on mainly the parts that differ from the above. Note that the same effects as those in the aforementioned embodiments can be obtained.

Modified Example 1

In a display device DSP of Modified Example 1, the configuration of a bank 1212 (insulating layer 12) differs from that in the display device DSP of the aforementioned embodiment.

Figure 6:
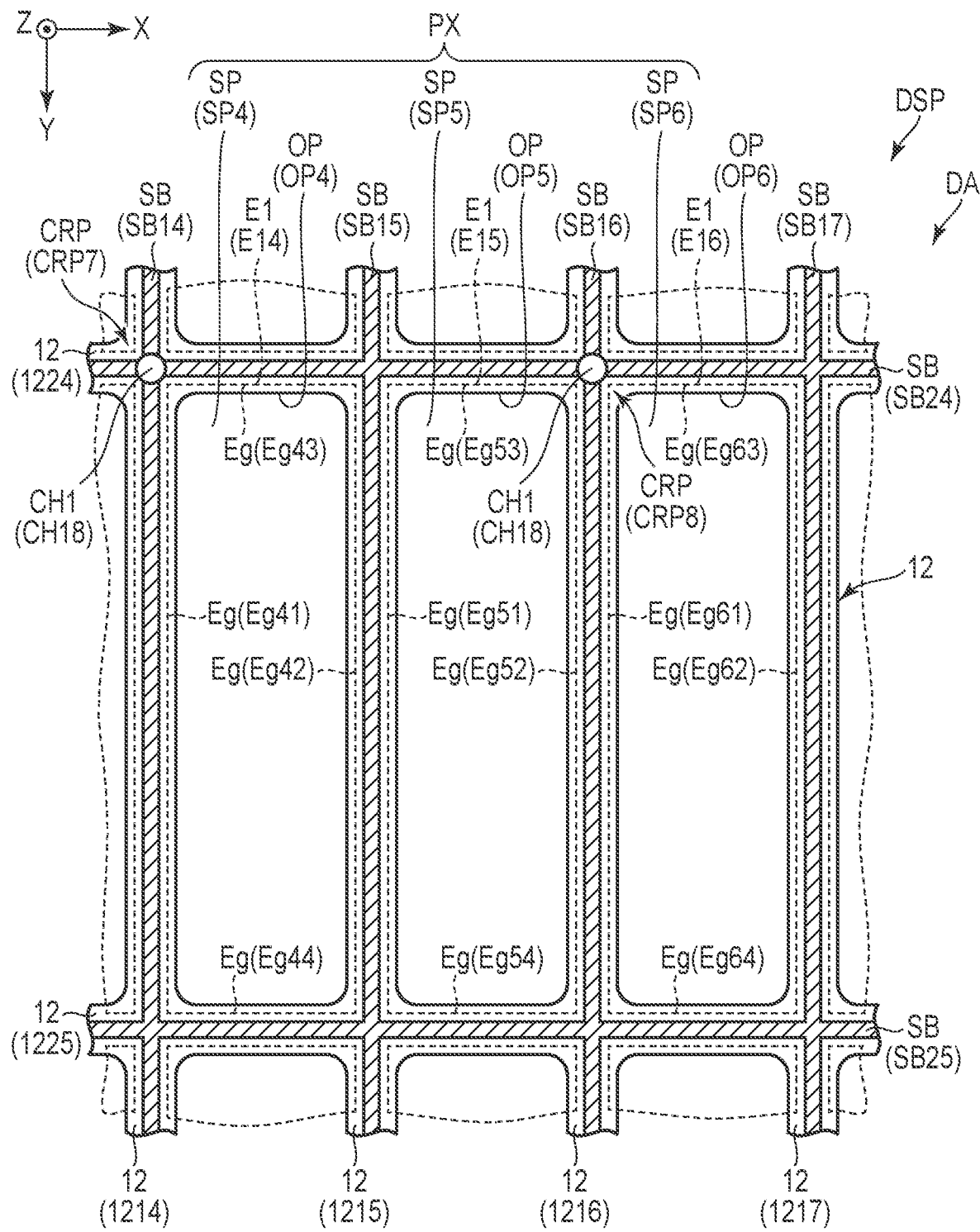
FIG. 6 is a plan view showing a configuration example of a pixel according to Modified Example 1.

FIG. 6 is a plan view showing a configuration example of a pixel PX according to Modified Example 1. FIG. 6 shows only the configuration necessary for explanation.

In the example shown in FIG. 6, the display device DSP comprises an insulating layer 12 (1214, 1215, 1216, 1217, 1223, and 1224), a lower electrode E1 (E14, E15, and E16), and a separation wall SB (SB14, SB15, SB16, SB17, SB24, and SB25), etc.

In the example shown in FIG. 6, the lower electrode E1 includes the lower electrodes E14, E15, and E16. The lower electrode E14 is disposed in a sub-pixel SP4. The lower electrode E15 is disposed in a sub-pixel SP5. The lower electrode E16 is disposed in a sub-pixel SP6. The lower electrodes E14 to E16 are aligned in a first direction X.

In the example shown in FIG. 6, the lower electrodes E14 to E16 are each formed in a rectangular shape that is longer in a second direction Y than in the first direction X. The lower electrode E14 has an edge Eg (Eg41) on the opposite side of the distal end side of an arrow in the first direction X, an edge Eg (Eg42) on the distal end side of the arrow in the first direction X, an edge Eg (Eg43) on the opposite side of the distal end side in the second direction Y, and an edge Eg (Eg44) on the distal end side in the second direction Y. The lower electrode E15 has an edge Eg (Eg51) on the opposite side of the distal end side of the arrow in the first direction X, an edge Eg (Eg52) on the distal end side of the arrow in the first direction X, an edge Eg (Eg53) on the opposite side of the distal end side of the second direction Y, and an edge Eg (Eg54) on the distal end side of the second direction Y. The lower electrode E16 has an edge Eg (Eg61) on the opposite side of the distal end side of the arrow in the first direction X, an edge Eg (Eg62) on the distal end side of the arrow in the first direction X, an edge Eg (Eg63) on the opposite side of the distal end side of the second direction Y, and an edge Eg (Eg64) on the distal end side of the second direction Y. Note that the lower electrode E1 may be formed in a shape other than a rectangular shape in planar view.

In the example shown in FIG. 6, the insulating layer 12 includes insulating layers (banks) 1214, 1215, 1216, 1217, 1224, and 1225. The insulating layers 1214, 1215, 1216, and 1217 extend in the second direction Y. The insulating layers 1214 to 1217 are arranged at intervals in the first direction X. Insulating layers 1214, 1215, 1216, and 1217 are lined up in the described order toward the distal end side of the arrow in the first direction X. The insulating layers 1224 and 1225 extend in the first direction X. The insulating layers 1224 and 1225 are arranged at intervals in the second direction Y. The insulating layers 1224 and 1225 are lined up in the described order toward the distal end side of the arrow in the second direction Y. The insulating layers 1214 to 1217 intersect with the insulating layers 1224 and 1225, respectively.

In the example shown in FIG. 6, the insulating layer 12 includes an opening OP4 superposed on the lower electrode E14, an opening OP5 superposed on the lower electrode E15, and an opening OP6 superposed on the lower electrode E16. The opening OP4 corresponds to an area surrounded by the insulating layers 1214 and 1215 and the insulating layers 1224 and 1225. In other words, the center of the lower electrode 514 superposed on the opening OP4 is exposed from the insulating layer 12. In addition, the corners of the opening OP4 are rounded (or have an R). Note that the corners of the opening OP4 need not be rounded, and may intersect at right angles. The opening OP5 corresponds to an area surrounded by the insulating layers 1215 and 1216 and the insulating layers 1224 and 1225. In other words, the center of the lower electrode 515 superposed on the opening OP5 is exposed from the insulating layer 12. In addition, the corners of the opening OP5 are rounded (or have an R). Note that the corners of the opening OP5 do not have to be rounded, and may intersect at right angles. The opening OP6 corresponds to an area surrounded by the insulating layers 1216 and 1217 and the insulating layers 1224 and 1225. In other words, the center of the lower electrode 516 superposed on the opening OP6 is exposed from the insulating layer 12. In addition, the corners of the opening OP6 are rounded (or have an R). Note that the corners of the opening OP6 do not have to be rounded, and may intersect at right angles.

In the example shown in FIG. 6, the insulating layer 12 covers the peripheral edge of each of the lower electrodes 514 to E16. The insulating layer 1224 is superposed on the edge Eg43 of the lower electrode E14, the edge Eg53 of the lower electrode E15, and the edge Eg63 of the lower electrode E16. The insulating layer 1225 is superposed on the edge Eg44 of the lower electrode E14, the edge Eg54 of the lower electrode E15, and the edge Eg64 of the lower electrode E16. The insulating layer 1214 is superposed on the edge Eg41 of the lower electrode E14. The insulating layer 1215 is superposed on the edge Eg42 of the lower electrode E14 and the edge Eg51 of the lower electrode E15. The insulating layer 1216 is superposed on the edge Eg52 of the lower electrode E15 and the edge Eg61 of the lower electrode E16. The insulating layer 1217 is superposed on the edge Eg62 of the lower electrode E16.

In the example shown in FIG. 6, the separation wall SB includes separation walls SB14, SB15, SB16, SB17, SB24, and SB25. The separation walls SB14, SB15, SB16, and SB17 extend in the second direction Y. The separation walls SB14 to SB17 are arranged at intervals in the first direction X. For example, the separation walls SB14 to SB17 are lined up in the described order toward the distal end side of the arrow in the first direction X. The separation walls SB24 and SB25 extend in the first direction X. The separation walls SB24 and SB25 are arranged at intervals in the second direction Y. For example, the separation walls SB24 and SB25 are lined up in the described order toward the distal end side of the arrow in the second direction Y. The separation walls SB14 to SB17 intersect with the separation walls SB24 and SB25, respectively.

In the example shown in FIG. 6, the separation wall SB14 is superposed on the insulating layer 1214, the separation wall SB15 is superposed on the insulating layer 1215, the separation wall SB16 is superposed on insulating layer 1216, and the separation wall SB17 is superposed on the insulating layer 1217. The separation wall SB24 is superposed on the insulating layer 1224, and the separation wall SB25 is superposed on the insulating layer 1225. The separation walls SB14 to SB17 and the separation walls SB24 and SB25 are not superposed on the lower electrode E1. Note that the separation walls SB14 to SB17 and the separation walls SB24 and SB25 may also be superposed on the lower electrode E1.

In the example shown in FIG. 6, the separation wall SB and the insulating layer 12 includes an intersection CRP7 where the separation wall SB14 and the insulating layer 1214 intersect with the separation wall SB24 and the insulating layer 1224, and an intersection CRP8 where the separation wall SB16 and the insulating layer 1216 intersect with the separation wall SB24 and the insulating layer 1224. In the intersection CRP7, a contact hole CH17 is formed. In the intersection CRP8, a contact hole CH18 is formed.

The sub-pixels SP4, SP5, and SP6 configuring one pixel PX are each formed in a rectangular shape. The sub-pixels SP4 to SP6 are formed in approximately a rectangular shape extending in the second direction Y. The sub-pixels SP4 to SP6 are aligned in the first direction X. The widths of the sub-pixels SP4 to SP6 in the first direction X are the same. The widths of the sub-pixels SP4 to SP6 in the second direction Y are the same. The areas of the sub-pixels SP4 to SP6 are the same. Note that the areas of the sub-pixels SP4 to SP6 may also be different.

Figure 7:
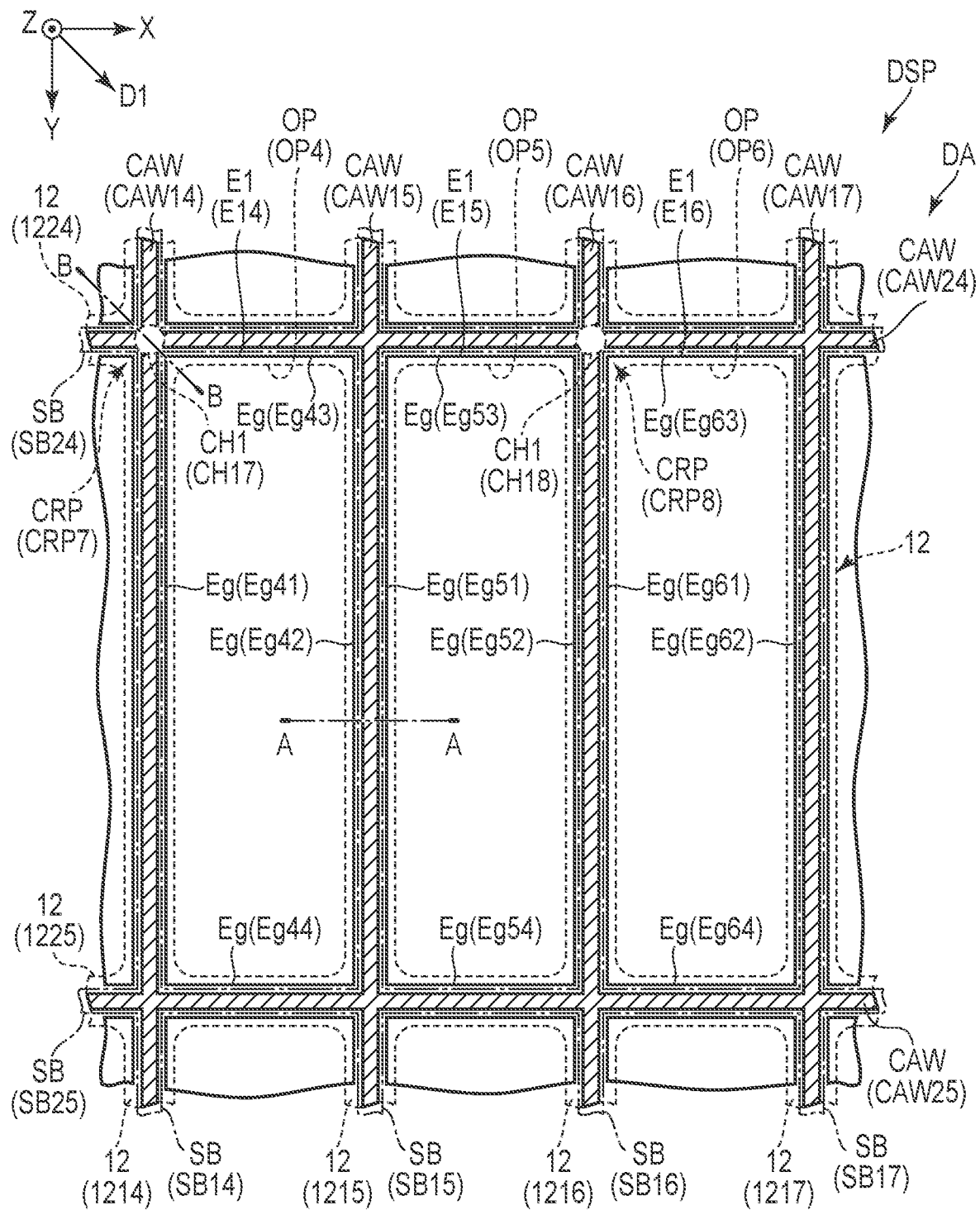
FIG. 7 is a plan view showing a configuration example of an auxiliary wiring according to Modified Example 1.

FIG. 7 is a plan view showing a configuration example of the auxiliary wiring CAW according to Modified Example 1. The configuration shown in FIG. 7 corresponds to the configuration shown in FIG. 6. FIG. 7 shows only the configuration necessary for explanation.

The display device DSP comprises the auxiliary wiring CAW and other components. In the example shown in FIG. 7, the display device DSP comprises the insulating layers 12 (1214, 1215, 1216, 1217, 1224, and 1225), the lower electrode E1 (E14, E15, and E16), the separation wall SB (SB14, SB15, SB16, SB17, SB24, and SB25), and the auxiliary wiring CAW (CAW14, CAW15, CAW16, CAW17, CAW24, and CAW25), etc.

In the example shown in FIG. 7, the auxiliary wiring CAW includes the auxiliary wirings CAW14, CAW15, CAW16, CAW17, CAW24, and CAW25. The auxiliary wirings CAW14, CAW15, CAW16, and CAW17 extend in the second direction Y. The auxiliary wirings CAW14 to CAW17 are arranged at intervals in the first direction X. For example, the auxiliary wirings CAW14, CAW15, CAW16, and CAW17 are lined up in the described order toward the distal end of the arrow in the first direction X. The auxiliary wirings CAW24 and CAW25 extend in the first direction X. For example, the auxiliary wirings CAW24 and CAW25 are lined up in the described order toward the distal end of the arrow in the second direction Y. The auxiliary wirings CAW14 to CAW17 intersect with the auxiliary wirings CAW24 and CAW 25, respectively.

In the example shown in FIG. 7, the auxiliary wiring CAW14 is superposed on the insulating layer 1214, the auxiliary wiring CAW15 is superposed on the insulating layer 1215, the auxiliary wiring CAW16 is superposed on the insulating layer 1216, and the auxiliary wiring CAW17 is superposed on the insulating layer 1217. The auxiliary wiring CAW24 is superposed on the insulating layer 1224, and the auxiliary wiring CAW25 is superposed on the insulating layer 1225. The auxiliary wirings CAW14 to CAW17 and the auxiliary wirings CAW24 and CAW25 are not superposed on the lower electrode E1. Note that the auxiliary wirings CAW14 to CAW17 and the auxiliary wirings CAW24 and CAW25 may also be superposed on the lower electrode E1.

In the example shown in FIG. 7, the auxiliary wiring CAW14 is superposed on the separation wall SB14, the auxiliary wiring CAW15 is superposed on the separation wall SB15, the auxiliary wiring CAW16 is superposed on the separation wall SB16, and the auxiliary wiring CAW17 is superposed on the separation wall SB17. Note that the auxiliary wiring CAW14 does not have to be superposed on the separation wall SB14, the auxiliary wiring CAW15 does not have to be superposed on the separation wall SB15, the auxiliary wiring CAW16 does not have to be superposed on the separation wall SB16, and the auxiliary wiring CAW17 does not have to be superposed on the separation wall SB17. The auxiliary wiring CAW24 is superposed on the separation wall SB24, and the auxiliary wiring CAW25 is superposed on the separation wall SB25. Note that the auxiliary wiring CAW24 does not have to be superposed on the separation wall SB24, and the auxiliary wiring CAW25 does not have to be superposed on the separation wall SB25.

Therefore, the display device DSP according to Modified Example 1 has the same effect as the display device DSP according to the embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a base;
   a first insulating layer disposed on the base;
   a first lower electrode disposed on the first insulating layer;
   a second lower electrode disposed on the first insulating layer, the second lower electrode being separated from the first lower electrode and being formed of the same material as the first lower electrode;

a first wiring disposed between the first lower electrode and the second lower electrode;
a second insulating layer disposed on the first wiring;
a first organic layer disposed on the first lower electrode and including a first light-emitting layer;
a second organic layer disposed on the second lower electrode and including a second light-emitting layer;
a first separation wall disposed on the second insulating layer; and
an upper wiring disposed continuously on the first organic layer, the second organic layer, and the first separation wall, wherein
the upper wiring is electrically connected to the first wiring via a contact hole that penetrates the first separation wall and the second insulating layer,
the second insulating layer includes an intersection where a first portion extending in a first direction intersects with a second portion extending in a second direction that intersects with the first direction,
the contact hole is formed on the intersection,
the first separation wall and the first wiring are superposed,
the second insulating layer covers a first edge of the first lower electrode and a second edge of the second lower electrode,
the first wiring is disposed in a lattice shape and surrounds the first lower electrode and the second lower electrode,
the first separation wall is disposed in a lattice shape and surrounds the first lower electrode and the second lower electrode, and
a width of the first separation wall is smaller than a width of the second insulating layer.

2. The display device of claim 1, wherein inner sides of the intersection are rounded.

3. The display device of claim 1, wherein the first wiring supplies an electric potential to the upper wiring.

4. The display device of claim 1, wherein a sum of a height of the first organic layer and a height of the upper wiring and a sum of a height of the second organic layer and a height of the upper wiring are smaller than a height of the first separation wall.

5. The display device of claim 1 comprising:
a third insulating layer disposed on the base;
a third lower electrode disposed on the third insulating layer;
a fourth lower electrode disposed on the third insulating layer, the fourth lower electrode being separated from the third lower electrode and being formed of the same material as the third lower electrode;
a second wiring disposed between the third lower electrode and the fourth lower electrode;
a fourth insulating layer disposed on the second wiring;
a third organic layer disposed on the third lower electrode and including a third light-emitting layer;
a fourth organic layer disposed on the fourth lower electrode and including a fourth light-emitting layer;
a first upper electrode disposed on the third organic layer;
a second upper electrode disposed on the fourth organic layer; and
a second separation wall disposed on the fourth insulating layer, wherein
the second separation wall separates the third organic layer and the fourth organic layer, and separates the first upper electrode and the second upper electrode.

6. The display device of claim 5, wherein
the first upper electrode covers the third organic layer and is separated from the second separation wall, and
the second upper electrode covers the fourth organic layer and is separated from the second separation wall.

7. The display device of claim 1, wherein the second insulating layer is superposed on a first edge of the first lower electrode, the first wiring, and a second edge of the second lower electrode.

8. A display device comprising:
a base;
a first insulating layer disposed on the base;
a first lower electrode disposed on the first insulating layer;
a second lower electrode disposed on the first insulating layer, the second lower electrode being separated from the first lower electrode, and being formed of the same material as the first lower electrode;
a first wiring disposed between the first lower electrode and the second lower electrode;
a second insulating layer disposed on the first wiring;
a first organic layer disposed on the first lower electrode and including a first light-emitting layer;
a second organic layer disposed on the second lower electrode and including a second light-emitting layer;
a first upper electrode disposed on the first organic layer;
a second upper electrode disposed on the second organic layer; and
a separation wall disposed on the second insulating layer, wherein
the separation wall separates the first organic layer and the second organic layer, and separates the first upper electrode and the second upper electrode,
the separation wall and the first wiring are superposed,
the second insulating layer is superposed on a first edge of the first lower electrode, the first wiring, and a second edge of the second lower electrode,
the second insulating layer covers the first edge of the first lower electrode and the second edge of the second lower electrode,
the first wiring is disposed in a lattice shape and surrounds the first lower electrode and the second lower electrode,
the separation wall is disposed in a lattice shape and surrounds the first lower electrode and the second lower electrode, and
a width of the separation wall is smaller than a width of the second insulating layer.

9. The display device of claim 8, wherein
the first organic layer is separated from the separation wall, and
the second organic layer is separated from the separation wall.

10. The display device of claim 9, wherein
the first upper electrode is separated from the separation wall, and
the second upper electrode is separated from the separation wall.

11. The display device of claim 8, wherein a sum of a height of the first organic layer and a height of the first upper electrode and a sum of a height of the second organic layer and a height of the second upper electrode are smaller than a height of the separation wall.

* * * * *